US012638143B2

(12) United States Patent
Chen et al.

(10) Patent No.: US 12,638,143 B2
(45) Date of Patent: May 26, 2026

(54) LED LIGHT SOURCE, BACKLIGHT ASSEMBLY, DISPLAY DEVICE AND LIGHTING DEVICE

(71) Applicant: ADVANCED OPTOELECTRONIC TECHNOLOGY, INC., Hsinchu County (TW)

(72) Inventors: Yu-Chia Chen, Hsinchu (TW); Hsin-Ting Hung, Hsinchu (TW); Chuang-Yu Hsieh, Hsinchu (TW)

(73) Assignee: ADVANCED OPTOELECTRONIC TECHNOLOGY, INC., Hsinchu County (TW)

( * ) Notice: Subject to any disclaimer, the term of this patent is extended or adjusted under 35 U.S.C. 154(b) by 19 days.

(21) Appl. No.: 18/676,740

(22) Filed: May 29, 2024

(65) Prior Publication Data

US 2025/0320974 A1 Oct. 16, 2025

(30) Foreign Application Priority Data

Apr. 11, 2024 (CN) .......................... 202410432107.7

(51) Int. Cl.
*F21K 9/64* (2016.01)
*F21Y 113/17* (2016.01)
*H01L 25/075* (2006.01)
*H01L 33/50* (2010.01)
(Continued)

(52) U.S. Cl.
CPC .............. *F21K 9/64* (2016.08); *H10H 20/851* (2025.01); *H10W 90/00* (2026.01); *F21Y 2113/17* (2016.08)

(58) Field of Classification Search
CPC ..... F21K 9/64; H01L 25/0753; H10H 20/851; F21Y 2113/17
See application file for complete search history.

(56) References Cited

U.S. PATENT DOCUMENTS

2007/0069220 A1* 3/2007 Ogihara .............. H01L 25/0753
257/E33.072
2011/0062864 A1* 3/2011 Shimizu ............... H10H 20/851
313/506
(Continued)

FOREIGN PATENT DOCUMENTS

JP 2004165604 A 6/2004
JP 2011176045 A 9/2011
(Continued)

OTHER PUBLICATIONS

TW 201401569, machine translation (Year: 2014).*

*Primary Examiner* — Tracie Y Green
(74) *Attorney, Agent, or Firm* — ScienBiziP, P.C.

(57) ABSTRACT

The present application provides an LED light source, a backlight assembly, a display device, and a lighting device. The LED light source includes a first light emitting component and a second light emitting component, the first light emitting component is a first light emitting chip, the second light emitting component is a photoluminescent layer or a second light emitting chip. The first light emitting chip has a light emitting spectrum with multiple waveforms, and the first light emitting chip is configured to emit at least blue light and green light. The second light emitting component is configured to emit red light.

3 Claims, 11 Drawing Sheets

(51) Int. Cl.
    *H10H 20/851*     (2025.01)
    *H10W 90/00*     (2026.01)

(56)                 References Cited

U.S. PATENT DOCUMENTS

| | | | |
|---|---|---|---|
| 2015/0301259 | A1* | 10/2015 | Park ........................ G02B 6/005 |
| | | | 349/65 |
| 2016/0133799 | A1* | 5/2016 | Park .................... H10H 20/8512 |
| | | | 252/301.4 F |
| 2020/0251638 | A1* | 8/2020 | Morris .................... H01L 24/08 |
| 2022/0336693 | A1* | 10/2022 | Inazu ................... H10H 20/824 |
| 2023/0155062 | A1* | 5/2023 | Liu ..................... H01L 25/0756 |
| | | | 257/89 |
| 2023/0329041 | A1* | 10/2023 | Jiao ........................ H10K 59/35 |
| | | | 257/40 |
| 2025/0029965 | A1* | 1/2025 | Yoo .................... H10H 20/8512 |

FOREIGN PATENT DOCUMENTS

| | | |
|---|---|---|
| JP | 2022553664 A | 12/2022 |
| KR | 10-2022-0088454 | 6/2020 |
| TW | 201401569 A | 1/2014 |

* cited by examiner

111

13

111

1
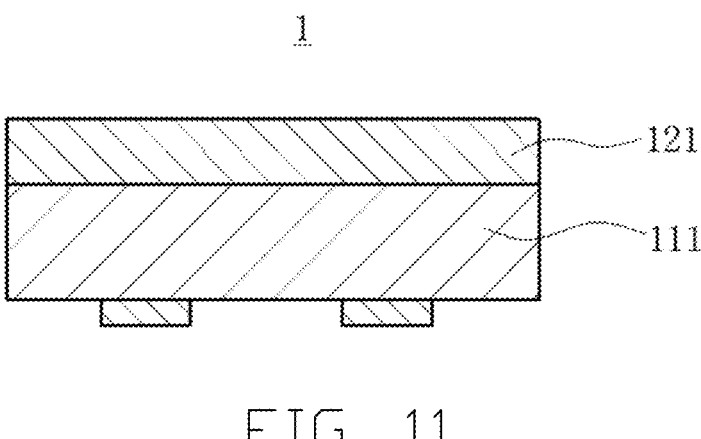
FIG. 11
1
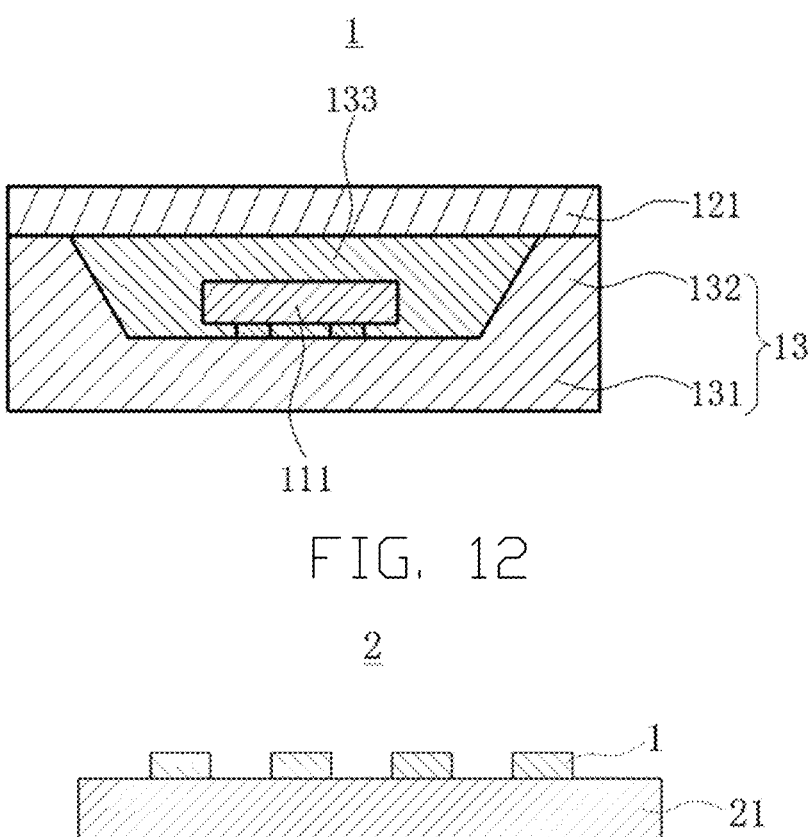
FIG. 12
FIG. 13

2

3

| Blue light LED of related technology I - C.I.E1931 | | |
|---|---|---|
| | x | y |
| Red light | 0.678 | 0.315 |
| Green light | 0.273 | 0.648 |
| Blue light | 0.147 | 0.046 |
| Color gamut | NTSC | sRGB |
| | 90.32% | 127.5% |

FIG. 19

| Blue-green light LED of present application - C.I.E1931 | | |
|---|---|---|
| | x | y |
| Red light | 0.692 | 0.304 |
| Green light | 0.201 | 0.703 |
| Blue light | 0.147 | 0.062 |
| Color gamut | NTSC | sRGB |
| | 106.28% | 150.1% |

FIG. 20

LED LIGHT SOURCE, BACKLIGHT ASSEMBLY, DISPLAY DEVICE AND LIGHTING DEVICE

FIELD

The subject matter relates to the technical field of LED light sources, and in particular, to an LED light source, a backlight assembly, a display device and a lighting device.

BACKGROUND

Light Emitting Diode (LED) light source is a solid-state semiconductor cold light source, it is the use of semiconductor compound materials made of PN junction photoelectric devices, commonly used in the display panel light source. The light source of the display panel usually uses red light, green light, and blue light for mixing in order to emit white light, usually there are two specific ways to achieve.

The first way is to use of three independent light emitting chips, respectively, blue light emitting chip, green light emitting chip and red light emitting chip, the three chips emit the corresponding color of light and then mixed to form white light. The second way is to use blue light emitting chip with green phosphor and red phosphor combination, blue light emitting chip emits blue light, green phosphor and red phosphor by the blue light emitting chip excitation of green light and red light, respectively, red, green and blue light mixing to form white light.

However, there are defects in both of the above realization methods. Among them, the first realization adopts a larger number of chips and higher costs, and is mostly applied to advertising signage displays with a longer viewing distance. The green light phosphor used in the second realization method is not pure enough in terms of the wavelength of the green light excited (narrower half-wave width), resulting in poor NTSC color gamut coverage, and is mostly applied to notebook computer panels and television panels, etc., which have a relatively close viewing distance. How to solve the above problem is a consideration for those skilled in the art.

SUMMARY

In view of this, the present application provides an LED light source, a backlight assembly, a display device, and a lighting device, which are intended to improve the NTSC color gamut coverage of the LED light source and reduce the manufacturing cost of the LED light source.

An LED light source includes a first light emitting component and a second light emitting component. The first light emitting component is a first light emitting chip, the first light emitting chip has a light emitting spectrum with multiple waveforms, and the first light emitting chip is configured to emit at least blue light and green light. The second light emitting component configured to emit red light. Wherein the blue and green light emitted by the first light emitting component is mixed with red light emitted by the second light emitting component to form white light.

The first light emitting chip includes a first semiconductor layer, a plurality of light emitting layers and a second semiconductor layer, the first semiconductor layer is provided with a first electrode, the second semiconductor layer is provided with a second electrode attached, the first electrode and the second electrode are configured to provide an electrical signal to drive the plurality of light emitting layers to emit light, the plurality of light emitting layers are made of the same light emitting material.

The first semiconductor layer is an N-type semiconductor layer and the second semiconductor layer is a P-type semiconductor layer; or, the first semiconductor layer is a P-type semiconductor layer and the second semiconductor layer is an N-type semiconductor layer.

The plurality of light emitting layers includes two light emitting layers, one of the two light emitting layers is configured to emit blue light, the other of the two light emitting layers is configured to emit green light.

The first light emitting chip is further configured to emit cyan light, the plurality of light emitting layers comprise three light emitting layers, and the three light emitting layers are respectively configured to emit blue light, green light, and cyan light.

The second light emitting component comprises a photoluminescent layer, the second light emitting component is provided in the light-out path of the first light emitting chip, and the second light emitting component is configured to be excited by light emitted from the first light emitting chip to form red light.

The second light emitting component comprises a second light emitting chip, the second light emitting chip is configured to emit red light.

The first light emitting chip and the second light emitting chip are provided horizontally or vertically stacked.

The first light emitting chip and the second light emitting chip are vertically stacked, the first light emitting chip is disposed on a light emitting chip of the second light emitting chip.

The present application also provides a backlight assembly includes the LED light source described above.

The present application also provide a display device includes a display panel and a backlight assembly as described above, the backlight assembly is used to provide a backlight to the display panel.

The present application also provide a lighting device includes an LED light source as described above.

The LED light source, backlight assembly, display device and lighting device of the present application, by using a single chip (i.e., the first light emitting chip) capable of emitting at least blue light and green light of higher purity, makes the light source of blue light and green light use only the same set of electrodes, and cooperates with the second light emitting component emitting red light for mixing, thereby forming white light. This application can not only greatly reduce the production cost of LED light source products, but also improve the purity of green light and thus improve the color gamut of the LED light source, to meet the wide color gamut requirements of the display device.

Compared with the use of photoluminescent materials to excite green light, this application utilizes chip luminescence to more easily make green light of specific wavelengths, especially green light of wavelengths below 530 nm, with reduced technical difficulty and cost, and is able to better satisfy the illumination needs of specific wavelengths of light required by lighting devices for the growth of animals and plants.

BRIEF DESCRIPTION OF THE DRAWINGS

FIG. 11 shows a schematic view of the LED light source of an eighth embodiment.

FIG. 12 shows a schematic view of the LED light source of a ninth embodiment.

FIG. 13 shows a schematic structure of a backlight assembly of a tenth embodiment.

FIG. 19 shows a statistical graph of the coverage data in the NTSC color gamut and the sRGB color gamut for the corresponding related technology I in FIG. 18.

FIG. 20 shows a statistical graph of the coverage data of the LED light source of the present application in the NTSC color gamut and the sRGB color gamut corresponding to FIG. 18.

DESCRIPTION OF MAIN COMPONENT SYMBOLS

| | |
|---|---|
| LED light source | 1 |
| first light emitting component | 11 |
| first light emitting diode | 111 |
| substrate | 1111 |
| cryogenic buffer layer | 1112 |
| first semiconductor layer | 1113 |
| luminescent layer | 1114 |
| second semiconductor layer | 1115 |
| first electrode | 1116 |
| second electrode | 1117 |
| Second light emitting component | 12 |
| photoluminescence | 121 |
| second light emitting diode | 122 |
| encapsulation bracket | 13 |
| base | 131 |
| reflective cup | 132 |
| encapsulation component | 133 |

-continued

| | |
|---|---|
| holding cavity | 134 |
| optical outlet | 135 |
| backlight assembly | 2 |
| backplane | 21 |
| display device | 3 |
| display panel | 31 |
| lighting device | 4 |

DETAILED DESCRIPTION

The following specific embodiments are merely exemplary in nature and are not intended to limit the disclosure or its applications and/or uses. It should be understood that a large number of variations exist. The specific embodiments will enable a person of ordinary skill in the art to realize the exemplary embodiments of the present disclosure without undue experimentation, and it should be understood that various changes or modifications may be made to the functions and structures described in the exemplary embodiments without departing from the scope of the present disclosure as set forth in the appended claims.

In the description of this application, it is to be understood that the terms "up", "down", "front", "back", "left", "right", "top", "bottom", "inner", "outside" and the like indicate orientations or positional relationships based on those shown in the accompanying drawings, and are intended only to facilitate the description of the present application and to simplify the description, and are not intended to indicate or imply that the device or element referred to must have a particular orientation, be constructed and operated in a particular orientation, and therefore are not to be construed as a limitation of the present application. Furthermore, the terms "first" and "second" are used only for descriptive purposes, and are not to be construed as indicating or implying relative importance or implicitly specifying the number of technical features indicated. Thus, a feature defined with the terms "first" and "second" may expressly or impliedly include one or more features. In the description of the present application, "more than one" means two or more, and at least one means that it may be one, two, or more than two, unless otherwise expressly and specifically limited.

Specific embodiments of the present application are described in further detail below with reference to FIGS. 1 through 21 of the accompanying drawings.

First Embodiment

Figures 1, 2:
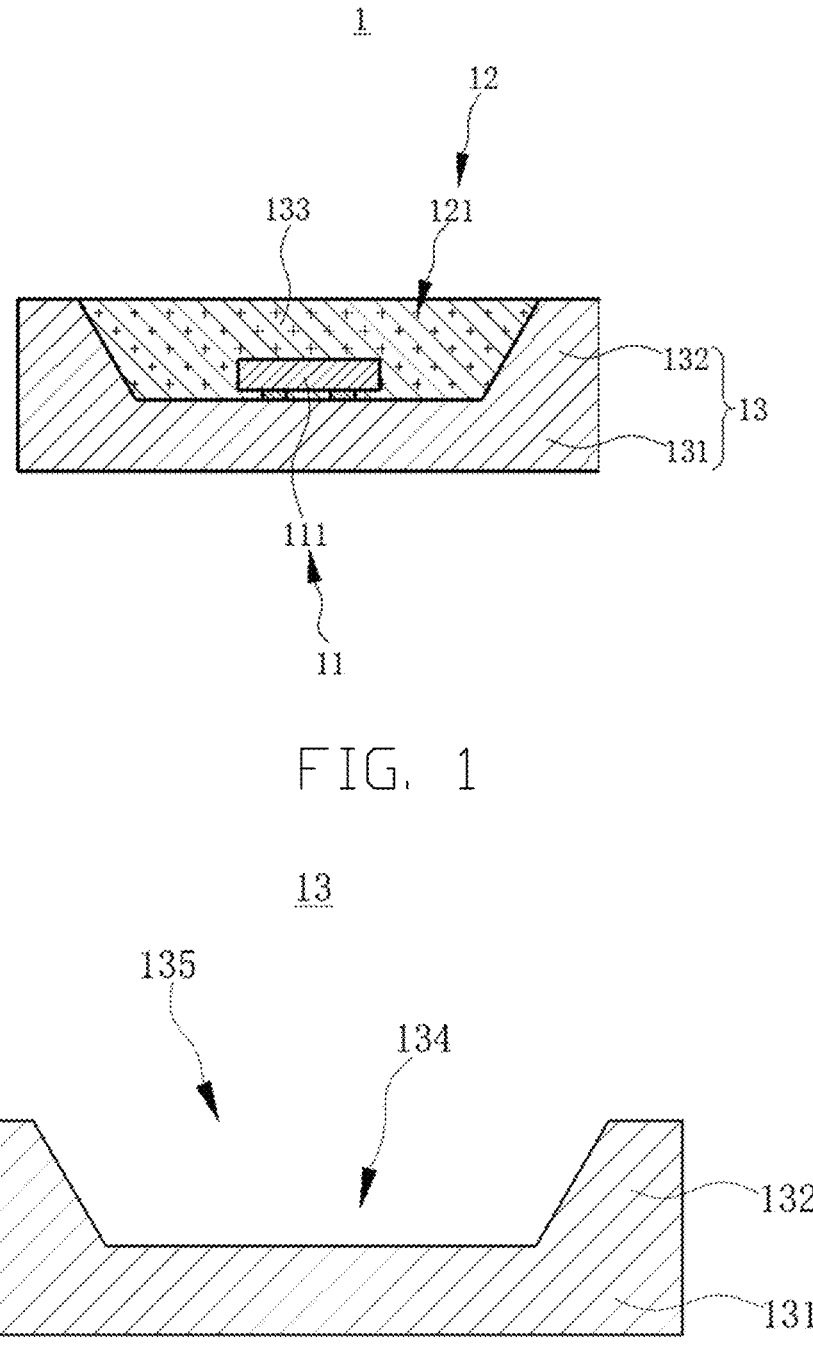
FIG. 1 shows a schematic view of a structure of an LED light source of a first embodiment.
FIG. 2 shows a schematic view of a structure of an encapsulation bracket of the first embodiment.

FIG. 1 shows a schematic view of a structure of an LED light source 1 of the first embodiment. FIG. 2 shows a schematic view of a structure of an encapsulation bracket 13 of the first embodiment.

Referring to FIG. 1, the present application provides an LED light source 1 includes a first light emitting component 11, a second light emitting component 12, and an encapsulation bracket 13. The encapsulation bracket 13 has a holding cavity 134 inside the encapsulation bracket 13, and the encapsulation bracket 13 has an opening on one side of the encapsulation bracket 13 to form an optical outlet 135. The first light emitting component 11 and the second light emitting component 12 are disposed in the holding cavity 134 of the encapsulation bracket 13. The first light emitting component 11 and the second light emitting component 12 are both capable of emitting light toward the light outlet 135 of the encapsulation holder 13. The first light emitting component 11 is configured to emit at least blue light and green light, and the second light emitting component 12 is configured to emit red light. The blue light and the green light emitted by the first light emitting component 11 is mixed with the red light emitted by the second light emitting component 12 to form a white light.

The first light emitting component 11 may also be configured to emit three wavelengths of light, namely, blue light, green light, and cyan light, of the needs of practical application scenarios. For example, the needs of illumination for the growth of animals and plants.

Referring to FIG. 1, the encapsulation holder 13 includes a base 131 and a reflective cup 132, the reflective cup 132 is provided on the upper side of the base 131. The reflective cup 132 is in the shape of a ring-shaped cup, the interior of the reflective cup 132 is the holding cavity 134, and the upper side opening of the reflective cup 132 is the light outlet 135. The light outlet 135 is located on the side of the reflective cup 132 away from the base 131. In the first embodiment, the base 131 may be made integrally with the reflective cup 132 by means of Liquid Crystal Polymer (LCD) material. Alternatively, plastic particles, ceramic particles, or a highly volatile solution may be mixed in the LCP material in the fabrication. The light outlet 135 of the reflective cup 132 is located on a side away from the base 131. In some other embodiments, the base 131 may be other forms of material or structure, such as a silver-plated copper plate, and the present application does not limit this.

Referring to FIG. 1, an encapsulation component 133 is provided in the reflective cup 132, the encapsulation component 133 covers the first light emitting component 11 and the second light emitting component 12. The encapsulation component 133 fills the holding cavity 134 in the reflective cup 132 to protect the first light emitting component 11 and the second light emitting component 12 disposed in the reflective cup 132.

Referring to FIG. 1, the first light emitting component 11 includes a first light emitting chip 111, and the first light emitting chip 111 may be any one of a general-sized LED chip, a mini-LED chip, and a Micro-LED chip. The LED light source 1 is not limited to a general-sized LED light source, but may also include a mini-LED light source and a Micro-LED light source in the sense of a mini-LED light source and a Micro-LED light source.

Figure 3:
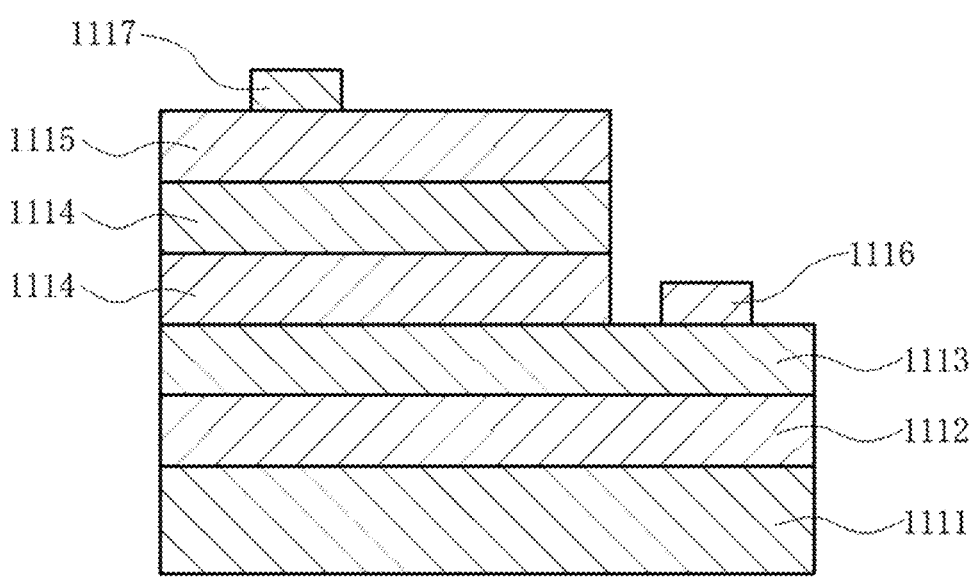
FIG. 3 shows a schematic view of a structure of a first light emitting chip of the first embodiment.

FIG. 3 shows a schematic view of a structure of the first light emitting chip 111 of the first embodiment.

Referring to FIG. 3, the first light emitting chip 111 includes a substrate 1111 and a cryogenic buffer layer 1112, a first semiconductor layer 1113, a plurality of light emitting layer 1114, and a second semiconductor layer 1115 stacked in sequence on an upper side of the substrate 1111. In some embodiments, the substrate 1111 includes gallium nitride (GaN), sapphire, silicon carbide, or silicon. The cryogenic buffer layer 1112 is a GaN cryogenic buffer layer 1112.

In some embodiments, the first semiconductor layer 1113 is an N-type semiconductor layer and the second semiconductor layer 1115 is a P-type semiconductor layer. The N-type semiconductor layer is disposed on the side of the plurality of light emitting layer 1114 proximate the substrate 1111. In some other embodiments, the first semiconductor layer 1113 may be a P-type semiconductor layer and the second semiconductor layer 1115 may be an N-type semiconductor layer. The P-type semiconductor layer is disposed on the side of the plurality of light emitting layer 1114 near the substrate 1111. The positions of the N-type semiconductor layer and the P-type semiconductor layer may be switched.

Preferably, in order to ensure the film-forming quality and the light emitting efficiency, the N-type semiconductor layer is located on the side of the plurality of light emitting layer 1114 that is set close to the substrate 1111, and the P-type semiconductor layer is located on the side of the plurality of light emitting layer 1114 that is set away from the substrate 1111. Furthermore, the multilayer stacked light emitting layer 1114 covers a portion of the N-type semiconductor layer, and the N-type semiconductor layer is connected to a first electrode 1116 on the upper side of the N-type semiconductor layer, and the first electrode 1116 is disposed on the portion of the N-type semiconductor layer that is not covered by the light emitting layer 1114. A second electrode 1117 is connected to the P-type semiconductor layer on the upper side of the P-type semiconductor layer. The first electrode 1116 and second electrode 1117 are configured to provide electrical signals to drive the plurality of light emitting layer 1114 to emit light.

The N-type semiconductor layer is an n-doped semiconductor layer and the P-type semiconductor layer is a p-doped semiconductor layer. When the first electrode 1116 is positive, the second electrode 1117 is negative. When the first electrode 1116 is negative, the second electrode 1117 is positive. The present application does not limit this.

The plurality of light emitting layer 1114 is a multilayer vertically stacked multiple quantum well structure (MQWs). In one embodiment, the number of plurality of light emitting layer 1114 is two, wherein one of the light emitting layers 1114 is configured to emit blue light and the another of the light emitting layers 1114 is configured to emit green light.

The term "vertically stacked" as used in the present application refers to sequentially stacked along the light emitting direction, or arranged perpendicular to the direction of the base 131.

The light emitting materials of the plurality of light emitting layer 1114 are all the same, specifically, the light emitting materials of the multilayer light emitting layer 1114 are InGaN, and the proportion of the In element in the light emitting material used to emit blue light is smaller than the proportion of the In element in the light emitting material used to emit green light.

The light emitting materials for emitting blue and green light are InGaN, and along the vertical direction of the first light emitting chip 111 for stacking, so that blue and green light are from the same light emitting chip. Two light emitting layers 1114 share the same set of electrodes or circuits, as compared to the use of a light emitting chip to emit only a wavelength of light, the present application greatly reduces the manufacturing cost of the LED chip. Due to the same light emitting materials of the light emitting materials for emitting blue and green light, lattice constants are more compatible, epitaxial defects are less, so can be stacked growth on the same substrate 1111.

The term "dual-wavelength" as used in this application refers to an LED spectrum with two emission wavelengths having different emission wavelengths. The term "multi-wavelength" as used herein refers to an LED spectrum with multiple emission wavelengths, each of which has a different emission wavelength. The term "emission wavelength" refers to a localized maximum at an emission wavelength that is at least twice as intense as the adjacent or neighboring emission wavelength.

The light emitting spectrum of the first light emitting chip 111 is multi-wavelength, specifically, the first light emitting chip 111 is configured to emit at least blue and green light.

Figure 4:
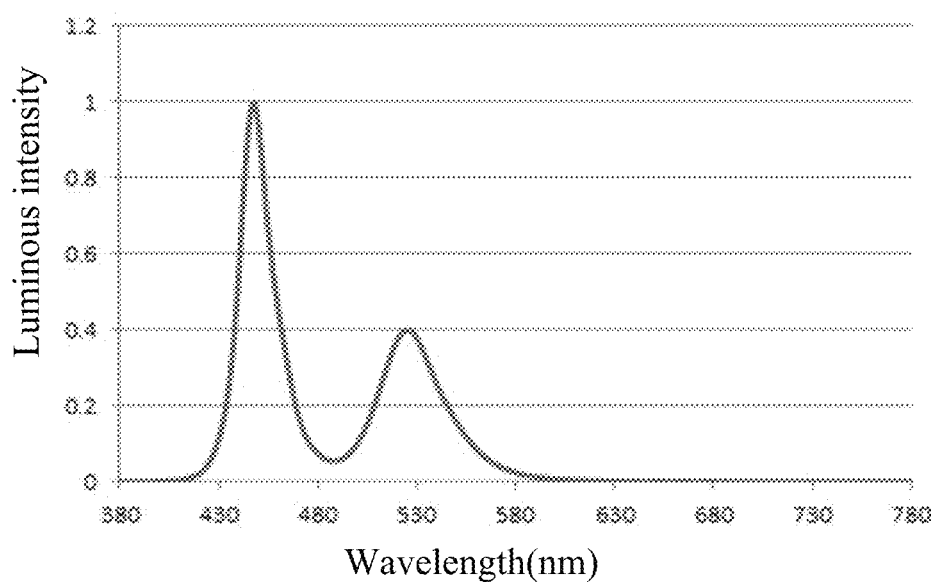
FIG. 4 shows a spectrogram of blue-green light emitted by the first light emitting chip of the first embodiment.

FIG. 4 shows a spectrogram of blue-green light emitted by the first light emitting chip 111 of the first embodiment.

Referring to FIG. 4, the light emitting spectrum of the first light emitting chip 111 is a double-wave wavelength, and the first light emitting chip 111 is used to emit only blue and green light, which can be used as a backlight light source for liquid crystal display (LCD) panels. The purity of the green light in this embodiment is higher, thereby improving the color gamut of the applied display device to meet the wide color gamut requirement. And the color mixing effect is better.

Referring to FIG. 1, the second light emitting component 12 is a photoluminescent layer 121, and the photoluminescent layer 121 may be at least one of a red phosphor and an orange phosphor. The second light emitting component 12 may be a red phosphor or an orange phosphor, or a mixture of both. The red phosphor includes at least one of KSiF phosphor (fluoride red phosphor) and Nitride phosphor. Similarly, the orange phosphor includes at least one of KSiF phosphor (fluoride red phosphor) and Nitride phosphor.

The red phosphor and the orange phosphor are dispersed in the light exit path of the first light emitting chip 111, and the red phosphor and the orange phosphor are dispersed in the encapsulation component 133.

The red phosphor or the orange phosphor in this embodiment is a photoluminescent material in the band of 580 nm to 800 nm. In other embodiments, other wavelength photoluminescent materials may also be selected of the actual application requirements.

Second Embodiment

Figure 5:
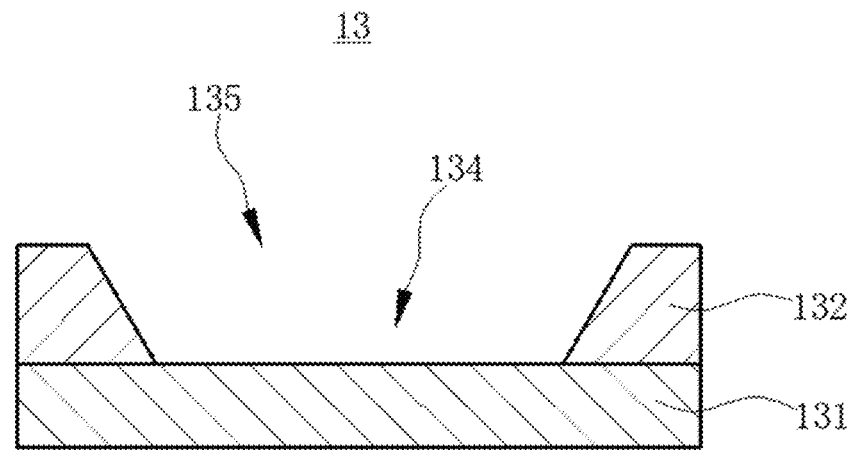
FIG. 5 shows a schematic view of a structure of an encapsulation holder of a second embodiment.

FIG. 5 shows a schematic view of the structure of the encapsulation holder 13 of the second embodiment. Referring to FIG. 3, the second embodiment differs from the first embodiment in that the base 131 and the reflective cup 132 are separately fabricated by different materials, for example, the base 131 is a silicon base 131, a plastic base 131, or a ceramic base 131, etc., and the reflective cup 132 is fabricated from LCP.

Third Embodiment

Figure 6:
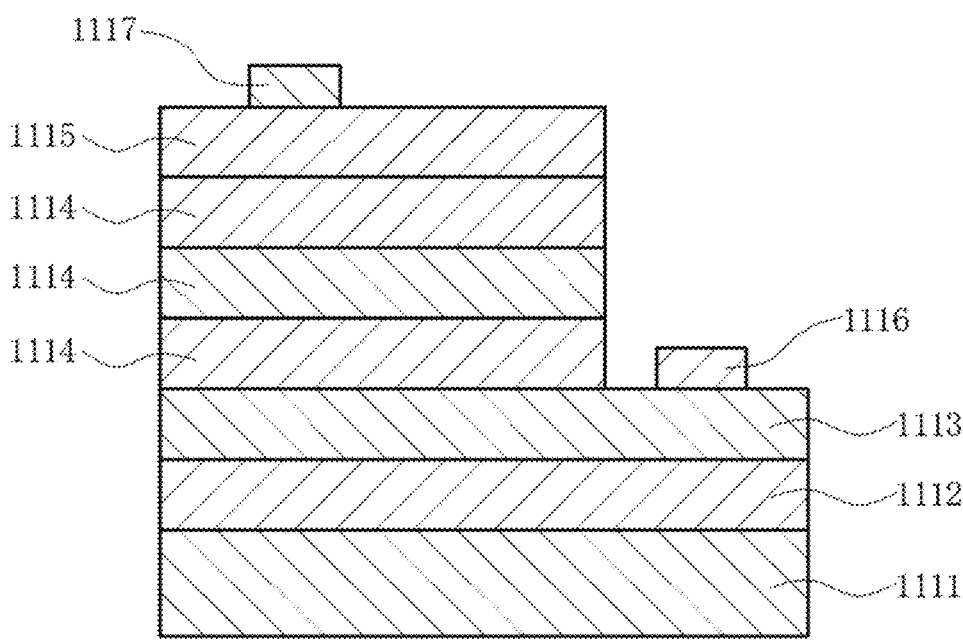
FIG. 6 shows a schematic view of the structure of the first light emitting chip of a third embodiment.

FIG. 6 shows a schematic view of the structure of the first light emitting chip 111 of the third embodiment.

Referring to FIG. 6, the third embodiment differs from the first embodiment in that the plurality of light emitting layers 1114 includes three stacked light emitting layers 1114 configured to emit blue light, green light, and cyan light, respectively. The light emitting spectrum of the first light emitting chip 111 has three waveforms. The wavelength of the cyan light is between 480 nm and 500 nm. The light emitting materials of the three light emitting layers 1114 are all InGaN, and the proportion of In elements in the light emitting material for emitting blue light, the light emitting material for emitting cyan light, and the light emitting material for emitting green light decreases in turn.

The present embodiment can be applied in the field of lighting lamps for animals and plants. Among them, in plant lighting, normally, the wavelength of the blue light is between 400 nm and 499 nm, the wavelength of the green light is between 500 nm and 599 nm, the wavelength of the red light is between 600 nm and 699 nm, and the wavelength of the far-red light is between 700 nm and 780 nm. The first light emitting chip 111 may be set to emit light of a plurality of different color combinations of the growth lighting needs of different animals and plants, and the present application does not limit this.

Fourth Embodiment

Figures 7, 8:
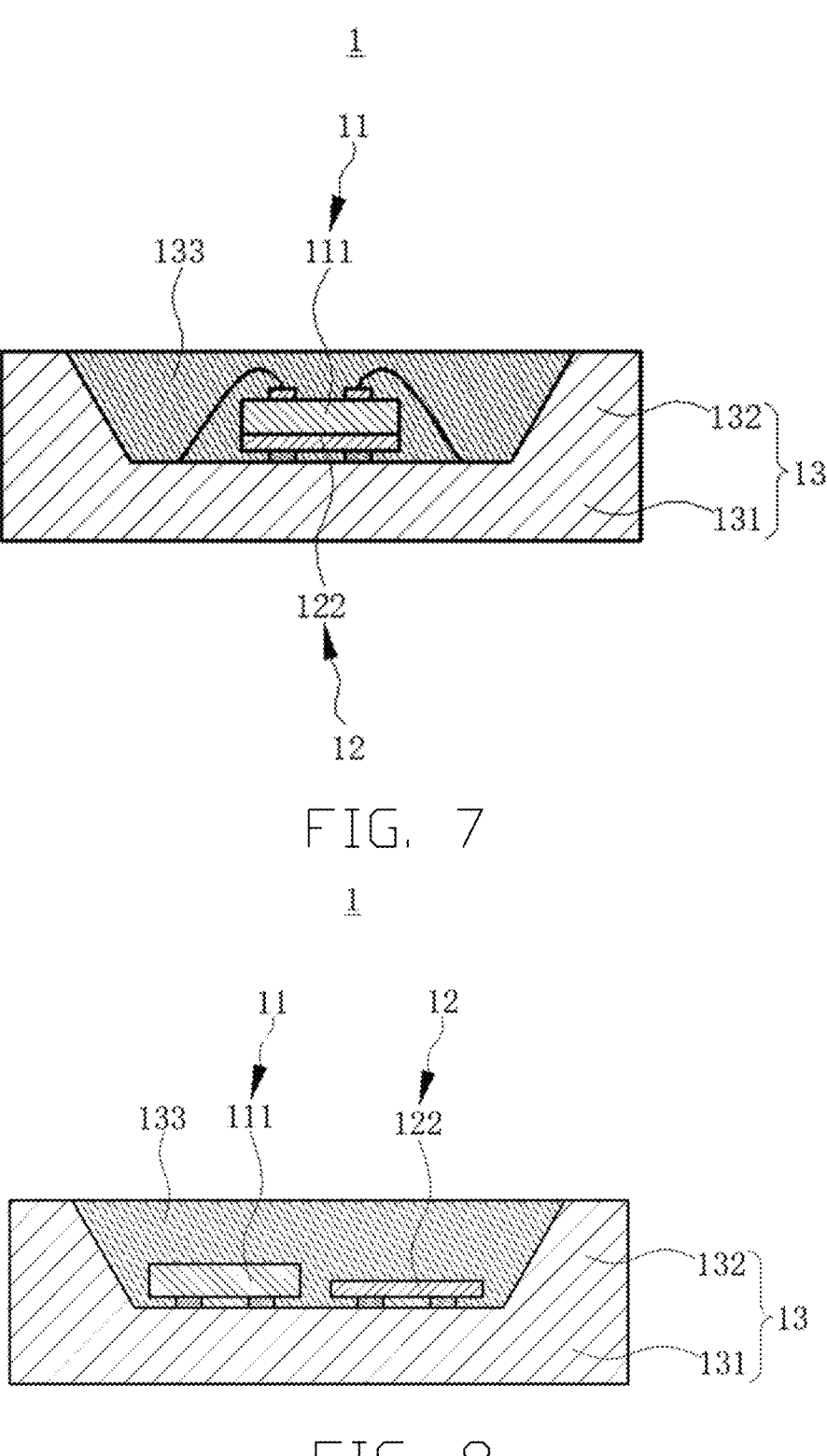
FIG. 7 shows a schematic view of the LED light source of a fourth embodiment.
FIG. 8 shows a schematic view of the LED light source of a fifth embodiment.

FIG. 7 shows a schematic view of the LED light source 1 of the fourth embodiment. Referring to FIG. 7, the fourth embodiment differs from the first embodiment in that the second light emitting component 12 is a second light emitting chip 122, the second light emitting chip 122 is a red LED chip, and the second light emitting chip 122 is configured to emit red light. The second light emitting chip 122 includes a red light emitting layer using a red light emitting material epitaxial, and the red light emitting material may be an AlGaInP.

Referring to FIGS. 2 and 7, the first light emitting chip 111 and the second light emitting chip 122 are stacked and arranged in a direction perpendicular to the base 131. In this embodiment, as a preferred embodiment, the first light emitting chip 111 is disposed in the light emitting path of the second light emitting chip 122. The second light emitting chip 122 is disposed on the side of the first light emitting chip 111 that is backed away from the light exit port 135. As illustrated in FIG. 7, the second light emitting chip 122 is located below the first light emitting chip 111. In this way, the overall size of the LED light source 1 can be reduced to save installation space.

As red light has a longer wavelength and a smaller energy gap, blue light has a shorter wavelength and a larger energy gap. Therefore, red light is able to cross the energy gap of the blue light emitting material energy gap. And when the substrate 1111 adopts a sapphire substrate, the energy gap of the sapphire substrate is larger, and the substrate 1111 is transparent for the blue light and the red light. Therefore, the present embodiment places the second light emitting chip 122 on the side where the first light emitting chip 111 is back away from the light outlet 135, which can improve the light emitting efficiency.

Referring to FIG. 7, the first light emitting chip 111 is fixed in the encapsulation bracket 13 using a Face up Chip encapsulation method, the first electrode 1116 and the second electrode 1117 of the first light emitting chip 111 are disposed in a direction away from the base 131. The second light emitting chip 122 is fixed in the encapsulation bracket 13 using a Flip Chip encapsulation method, the electrodes of the second light emitting chip 122 are all provided in a direction toward the base 131. In order to avoid blocking of light by the substrate 1111, the substrate 1111 material of the first light emitting chip 111 and the second light emitting chip 122 should be a material with a large energy gap, or else the substrate 1111 of the first light emitting chip 111 and the second light emitting chip 122 will eventually be stripped off in order to improve the light emitting efficiency.

Fifth Embodiment

FIG. 8 shows a schematic view of the LED light source 1 of the fifth embodiment.

Referring to FIG. 8, the fifth embodiment differs from the first embodiment in that the first light emitting chip 111 and the second light emitting chip 122 are horizontally aligned within the encapsulation bracket 13, the term "horizontally aligned" as used herein refers to aligned in a direction parallel to the base 131.

The first light emitting chip 111 and the second light emitting chip 122 are both fixed in the encapsulation bracket 13 using a Flip Chip encapsulation method. The electrodes of the first light emitting chip 111 and the second light emitting chip 122 are both provided toward the base 131, which can avoid the electrodes crowding out the light emitting area and thus affecting the light emitting efficiency. In order to avoid the blocking of light by the substrate 1111, the material of the substrate 1111 of the first light emitting chip 111 and the second light emitting chip 122 should be a material with a large energy gap, or else the substrate 1111 of the first light emitting chip 111 and the second light emitting chip 122 will eventually be peeled off in order to improve the light emitting efficiency.

Sixth Embodiment

Figure 9:
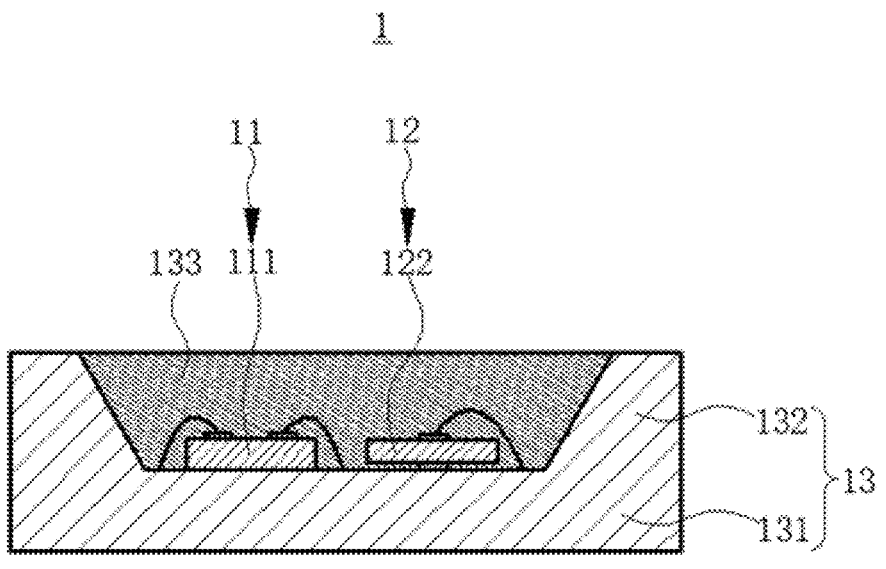
FIG. 9 shows a schematic view of the LED light source of a sixth embodiment.

FIG. 9 shows a schematic view of the LED light source 1 of the sixth embodiment.

Referring to FIG. 9, the sixth embodiment differs from the first embodiment in that the first light emitting chip 111 and the second light emitting chip 122 are arranged in a horizontally arranged manner. The first light emitting chip 111 is fixed in the encapsulation holder 13 using a Face up Chip encapsulation method. The first electrode 1116 and the second electrode 1117 of the first light emitting chip 111 are both provided in a direction away from the base 131. The second light emitting chip 122 is fixed in the encapsulation holder 13 using a Vertical encapsulation method. One of the electrodes of the second light emitting chip 122 is provided toward the base 131, and another electrode is provided in a direction away from the base 131.

When the first light emitting chip 111 and the second light emitting chip 122 are arranged horizontally, each of the first light emitting chip 111 and the second light emitting chip 122 may be packaged in any one of Face up Chip, Vertical Packaging, or Flip Chip. In order to emphasize the inventive conception of the present application, the present application does not exhaust the combination of the packaging forms of the first light emitting chip 111 and the second light emitting chip 122, and only exemplary illustrations are provided in FIGS. 7, 8, and 9.

Seventh Embodiment

Figure 10:
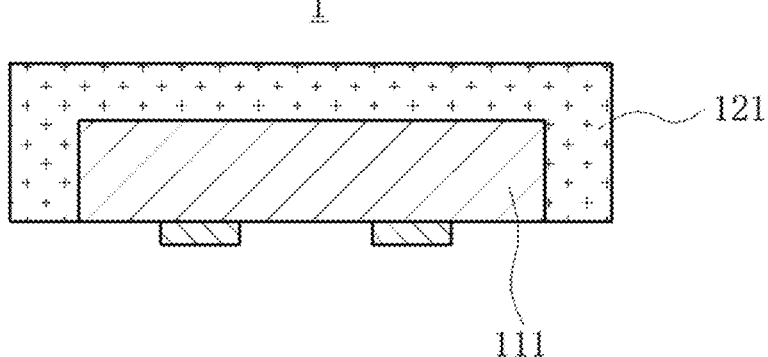
FIG. 10 shows a schematic view of the LED light source of a seventh embodiment.

FIG. 10 shows a schematic view of the structure of the LED light source 1 of the seventh embodiment.

Referring to FIG. 10, the seventh embodiment differs from the first embodiment in that the first light emitting chip 111 is packaged differently. The packaging structure of the first light emitting chip 111 in the seventh embodiment is Chip Scale Package (CSP). The first light emitting chip 111 is a five-surface light emitting structure. The photoluminescent layer 121 is at least one of a red phosphor or an orange phosphor. The photoluminescent layer 121 wraps the five light emitting surfaces of the first light emitting chip 111.

In other embodiments, the first light emitting chip 111 may also be four-sided light emitting structure or single-sided light emitting structure, and the present application does not limit this.

In other embodiments, the packaging structure of the first light emitting chip 111 may also be a full name: Near Chip Scale Package (NCSP package), which is not limited by this application.

Eighth Embodiment

FIG. 11 shows a schematic view of the structure of the LED light source 1 of the eighth embodiment.

Referring to FIG. 11, the eighth embodiment differs from the seventh embodiment in that the photoluminescent layer 121 is a thin-film photoluminescent layer, and the thin-film photoluminescent layer is made of a thin-film photoluminescent material, such as a QD photoluminescent material or the like. The size of the thin-film photoluminescent layer may be designed of the need. For example, in the eighth embodiment the size of the thin-film photoluminescent layer may be close to the size of the first light emitting chip 111 using CSP package or NCSP package, so that the thin-film photoluminescent material is affixed to the light emitting surface directly above the first light emitting chip 111. In some other embodiments, the photoluminescent layer 121 is a larger sized thin film photoluminescent layer to cover the light emitting surface of the plurality of first light emitting chips 111.

Ninth Embodiment

FIG. 12 shows a schematic view of the structure of the LED light source 1 of the ninth embodiment.

Referring to FIG. 12, the ninth embodiment differs from the eighth embodiment in that the first light emitting chip 111 is an encapsulated structure containing an encapsulated holder 13, specifically, the packaging structure of the first light emitting chip 111 is a Flip Chip.

Tenth Embodiment

FIG. 13 shows a schematic view of the structure of the backlight assembly 2 of the tenth embodiment.

Referring to FIG. 13, a tenth embodiment of the present application provides a backlight assembly 2 includes a backplane 21 and a plurality of LED light sources 1 as described in any of the above embodiments attached to the backplane 21.

Eleventh Embodiment

Figure 14:
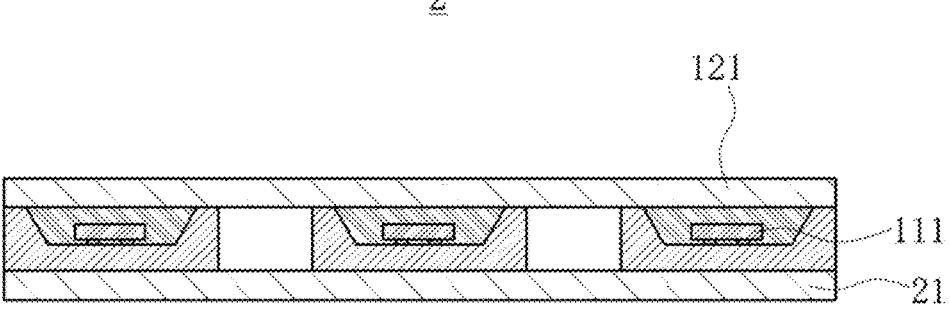
FIG. 14 shows a schematic view of a structure of the backlight assembly of an eleventh embodiment.

FIG. 14 shows a schematic view of the structure of the backlight assembly 2 of the eleventh embodiment.

Referring to FIG. 14, a tenth embodiment of the present application provides a backlight assembly 2 includes a backplane 21 and a plurality of first light emitting chips 111 and a single photoluminescent layer 121 connected to the backplane 21. The first light emitting chips 111 are first light emitting chips 111 as described in any of the above embodiments. The photoluminescent layer 121 is a thin-film photoluminescent layer, the photoluminescent layer 121 is of a larger size so as to cover the light output surface of the plurality of first light emitting chips 111.

Twelve Embodiment

Figure 15:
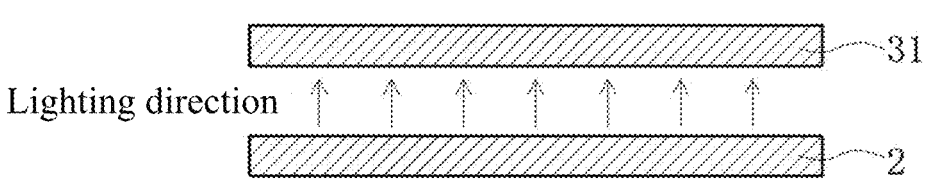
FIG. 15 shows a schematic structure of a display device of a twelfth embodiment.

FIG. 15 shows a schematic view of the structure of the display device 3 of the twelfth embodiment.

Referring to FIG. 15, a twelfth embodiment of the present application provides a display device 3 includes a display panel 31 and a backlight assembly 2 as described above, the display panel 31 is a liquid crystal display panel 31 (LCD), the backlight assembly 2 is used to provide a backlight to the display panel 31, the backlight assembly 2 is usually disposed at the bottom of the display device 3, and the shape and size of the backlight assembly 2 are adapted to the shape and size of the display device 3. The display panel 31 is located on the light-out side of the backlight assembly 2 and may be used to realize an image display. The display device 3 may adopt a straight-down backlight or a side-entry backlight structure, and the present application does not limit this.

Thirteenth Embodiment

Figure 16:
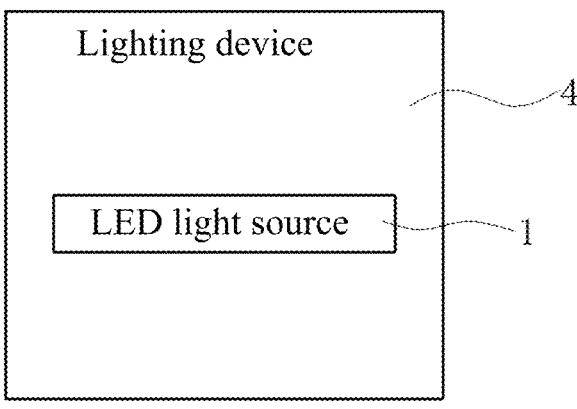
FIG. 16 shows a schematic structural view of a lighting device of a thirteenth embodiment.

FIG. 16 shows a schematic view of the structure of the lighting device 4 of the thirteenth embodiment.

Referring to FIG. 16, a thirteenth embodiment of the present application provides a lighting device 4 includes the LED light source 1 disclosed above, which can be applied in the field of illumination for growth of animals and plants.

Figure 17:
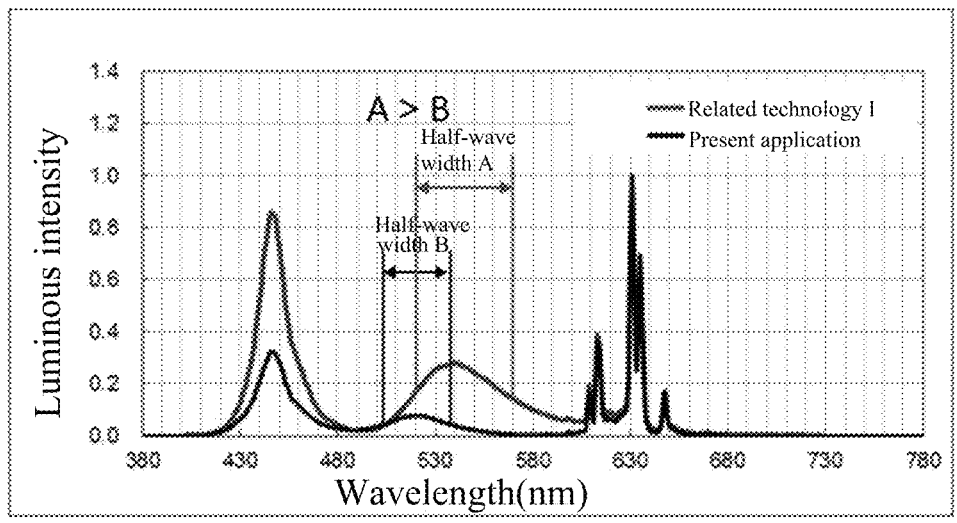
FIG. 17 shows a schematic view of a white light emission spectrogram of the LED light source provided in the present application in comparison with a white light emission spectrogram of the related technology I. The color of line of the related technology I forms no part of the claimed design.
Figure 18:
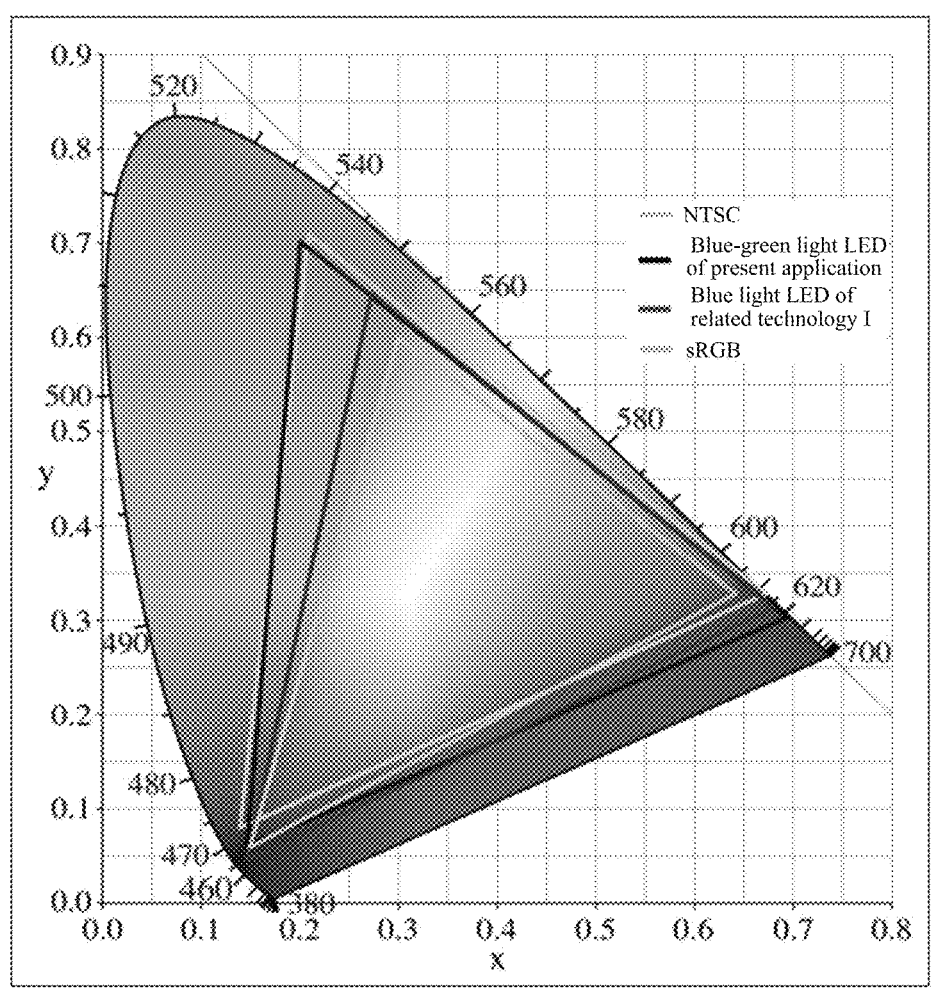
FIG. 18 shows the CIE 1931 chromaticity diagram provided in the present application for embodying the color gamut coverage of the LED light source of the present application against that of the related technology I. The color of the CIE 1931 chromaticity diagram showing in the color photographs forms no part of the claimed design.

FIG. 17 shows a schematic view of a white light emission spectrogram of the LED light source 1 provided in the present application in comparison with a white light emission spectrogram of the related technology I. FIG. 18 shows the CIE 1931 chromaticity diagram provided in the present application for embodying the color gamut coverage of the LED light source 1 of the present application against that of the related technology I. FIG. 19 shows a statistical graph of the coverage data in the NTSC color gamut and the sRGB color gamut for the corresponding related technology I in FIG. 18. FIG. 20 shows a statistical graph of the coverage data of the LED light source 1 of the present application in the NTSC color gamut and the sRGB color gamut corresponding to FIG. 18.

Among them, FIG. 17, FIG. 18, and FIG. 19 relate to the related technology I in which a blue light emitting chip is used with β-SiAlON green phosphor and KSiF red phosphor so as to emit white light.

Referring to FIGS. 17 and 18, the use of a blue light emitting chip with β-SiAlON green phosphor and KSiF red phosphor is the mainstream practice for LCD displays in a wide color gamut, and its emission spectra are shown as the red curve in FIG. 17. The emission spectrum of the LED light source 1 provided in this application is shown as the black curve in FIG. 17. It is obvious to contrast that the material properties of the green phosphor for the excitation spectrum, its half-wave width A is larger, resulting in poorer light color purity, and is the main reason why the related technology I cannot enhance the color gamut of the LED light source.

Referring to FIG. 4, the present application, in comparison with related technology I, changes the light emitting method of the green light from photoexcited light to electroluminescence, and integrates the green light and the blue light in one LED chip (first light emitting chip 111). So that the light emitting spectra of the first light emitting chip 111 shown in FIG. 4 is a double-wave wavelength, and the purity of the emitted blue light and the green light are both higher. It achieve a high color gamut effect, such as that shown in FIGS. 18 and 20, with a high color gamut effect.

Referring to FIGS. 17 and 18, in the LED light source 1 adopted in the present application, the green waveform half-wave width B of the light emitting spectrum of the first light emitting chip 111 is shorter (A>B) than the green waveform half-wave width A of the related technology I (the scheme of a pure blue light LED chip paired with a green phosphor). The waveform half-wave width of light emitted from the LED itself (the material of the light emitting layer 1114 is usually InGaN) is narrower than that of the excited phosphor is narrower, and the color purity is higher. As the first light emitting chip 111 green waveform half-wave width in this application is narrower, so the color purity of green on the CIE chromaticity view is purer, the color gamut coverage is larger, greatly improving the color gamut of the LED light source 1, to meet the requirements of the wide color gamut of the display device 3.

Referring to FIGS. 19 and 20, the related technology I has a maximum NTSC standard color gamut coverage of only 90%. However, the LED light source 1 provided in the present application can increase the NTSC standard color gamut coverage to more than 100%.

Due to the first light emitting chip 111 green light band of the light emitting spectrum half-wave width is narrower than the phosphor, and the LED chip can be easier than the phosphor to do the band adjustment, to achieve the phosphor cannot do the green band. The usually green phosphor to be able to excite the light of the following 530 nm band is more difficult to reach the 529 nm band of green phosphor is quite expensive, there is no usually green phosphor can do 520 nm, 510 nm band of green phosphor manufacturers. While the technical solution of this application utilizes chip luminescence, which can be adjusted between 510 nm to 540 nm, and is able to meet the light wavelength requirements of 520 nm and 510 nm, this application further reduces the manufacturing cost, and is able to meet the specific light wavelength requirements needed for animal and plant lighting.

Figure 21:
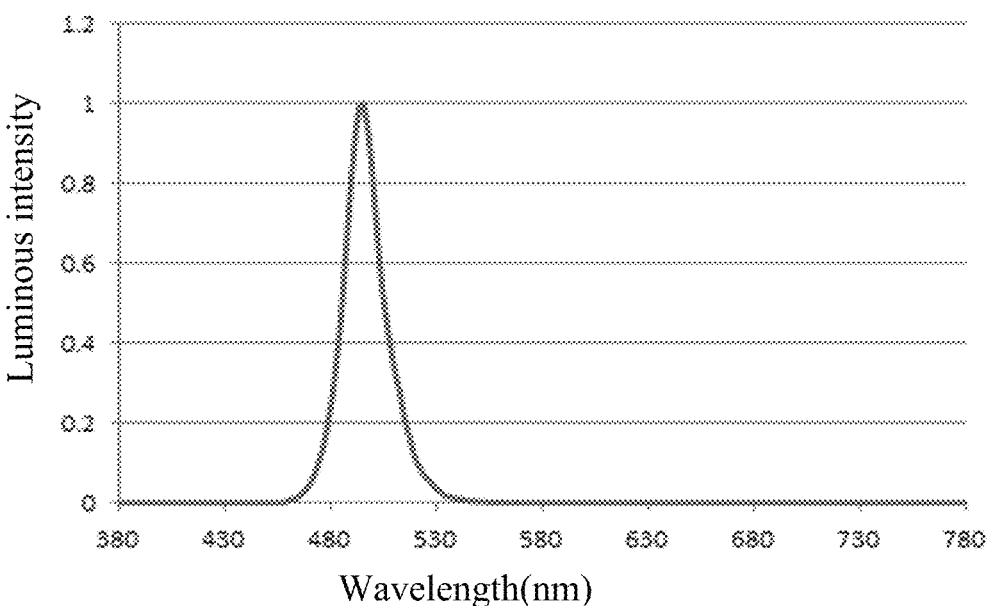
FIG. 21 shows a graph of the glaucoma spectrum of related technology II.

FIG. 21 shows the cyan light spectrum of the related technology II. This related technology II is an LED light emitting chip that uses blue light emitting material mixed with green light emitting material in the same light emitting layer. It is worth mentioning that in the related technology II involved in FIG. 21, the same electroluminescence is used as the first light emitting chip 111 provided in the present application. But instead of vertically stacking the blue light emitting material and the green light emitting material in the related technology II, the blue light emitting material and the green light emitting material are mixed in the same light emitting layer, whereby adjusting the light wave from a blue waveband to a green waveband, which in turn causes the related technology II to obtain the glare spectrum of a single wave wavelength as shown in FIG. 21.

When the double-wavelength blue-green light spectrum provided by the present application shown in FIG. 4 is compared with the cyan light spectrum of the related technology II shown in FIG. 21, the purity of the blue and green light emitted by the LED light source 1 provided by the present application is improved, which in turn improves the color gamut.

The LED light source 1 adopted in the present application integrates the light emitting sources of blue light and green light in one chip (the first light emitting chip 111). The LED light source 1 of the present application less costly to manufacture as compared to the use of separate light emitting chips for each of the blue light and green light.

Single chip vertically stacked with different wavelengths of light emitting materials is used in the LED light source 1 adopted in the present application Compared to other related technologies such as the scheme in which different light emitting chips arranged horizontally within the encapsulation bracket 13 emit blue light and green light, the LED light source 1 of the present application avoids color shifting at a short distance, and the color mixing effect is better.

The first light emitting chip 111 with multi-wavelength is paired with the second light emitting component 12 provided in this application can not only be able to reduce the manufacturing cost of the LED light source and can also improve the color gamut of the LED light source, and also easy to make light emitting chips with specific light wavelengths, which are able to satisfy both the wide color gamut requirements of the display device 3, and the specific wavelength requirements of the lighting device 4 for the growth of the animals and plants.

Above, specific embodiments of the present application are described with reference to the accompanying drawings. However, those of ordinary skill in the art can understand that various changes and substitutions can be made to the specific embodiments of the present application without departing from the spirit and scope of the present application. These changes and substitutions fall within the scope of the present application.

What is claimed is:

1. An LED light source, comprising:

a first light emitting component comprising a first light emitting chip, the first light emitting chip having a light emitting spectrum with multiple waveforms, the first light emitting chip configured to emit at least blue light and green light;

a second light emitting component configured to emit red light, wherein the blue light and green light emitted by the first light emitting component is mixed with the red light emitted by the second light emitting component to form white light; and the first light emitting chip comprises a first semiconductor layer, a plurality of light emitting layers, and a second semiconductor layer, the plurality of light emitting layers are vertically stacked between the first semiconductor layer and the second semiconductor layer, the plurality of light emitting layer is a multilayer vertically stacked multiple quantum well structure, the plurality of light emitting layers comprise two or three light emitting layers, two or three light emitting layers are vertically stacked, one light emitting layer of the plurality of light emitting layers is configured to emit blue light, another light emitting layer of the plurality of light emitting layers is configured to emit green light;

the second light emitting component comprises a second light emitting chip, the second light emitting chip is configured to emit red light;

the first light emitting chip and the second light emitting chip are vertically stacked, the first light emitting chip is disposed on a light emitting path of the second light emitting chip.

2. A backlight assembly comprising a backplane and an LED light source, the LED light source comprising:

a first light emitting component comprising a first light emitting chip, the first light emitting chip having a light emitting spectrum with multiple waveforms, the first light emitting chip configured to emit at least blue light and green light;

a second light emitting component configured to emit red light, wherein the blue light and green light emitted by the first light emitting component is mixed with the red light emitted by the second light emitting component to form white light, the first light emitting chip comprises a first semiconductor layer, a plurality of light emitting layers, and a second semiconductor layer, the plurality of light emitting layers are vertically stacked between the first semiconductor layer and the second semiconductor layer, the plurality of light emitting layer is a multilayer vertically stacked multiple quantum well structure, the plurality of light emitting layers comprise two or three light emitting layers, two or three light emitting layers are vertically stacked, one light emitting layer of the plurality of light emitting layers is configured to emit blue light, another light emitting layer of the plurality of light emitting layers is configured to emit green light; the second light emitting component comprises a second light emitting chip, the second light emitting chip is configured to emit red light.

3. A lighting device comprising an LED light source, the LED light source comprising:

a first light emitting component comprising a first light emitting chip, the first light emitting chip having a light emitting spectrum with multiple waveforms, the first light emitting chip configured to emit at least blue light and green light;

a second light emitting component configured to emit red light, wherein the blue light and green light emitted by the first light emitting component is mixed with the red light emitted by the second light emitting component to form white light, the first light emitting chip comprises a first semiconductor layer, a plurality of light emitting layers, and a second semiconductor layer, the plurality of light emitting layers are vertically stacked between the first semiconductor layer and the second semiconductor layer, the plurality of light emitting layer is a multilayer vertically stacked multiple quantum well structure, the plurality of light emitting layers comprise two or three light emitting layers, two or three light emitting layers are vertically stacked, one light emitting layer of the plurality of light emitting layers is configured to emit blue light, another light emitting layer of the plurality of light emitting layers is configured to emit green light;

the first light emitting chip and a second light emitting chip are vertically stacked, the first light emitting chip is disposed on a light emitting path of the second light emitting chip.

* * * * *